United States Patent
Wu et al.

(10) Patent No.: US 6,806,163 B2
(45) Date of Patent: Oct. 19, 2004

(54) ION IMPLANT METHOD FOR TOPOGRAPHIC FEATURE CORNER ROUNDING

(75) Inventors: Jie-Shing Wu, Hsin-Chu (TW); Hsueh-Li Sun, Hsin-Chu (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 0 days.

(21) Appl. No.: 10/190,248

(22) Filed: Jul. 5, 2002

(65) Prior Publication Data

US 2004/0005764 A1 Jan. 8, 2004

(51) Int. Cl.[7] .......................... H01L 21/76
(52) U.S. Cl. ............... 438/423; 438/589; 438/440
(58) Field of Search ................... 438/305, 440, 438/589, 770, 423

(56) References Cited

U.S. PATENT DOCUMENTS 5,223,445 A * 6/1993 Fuse
5,915,195 A * 6/1999 Fulford, Jr. et al. ......... 438/524
6,022,796 A * 2/2000 Berry et al. .................. 43/589
6,174,787 B1   1/2001 Fuller et al.
6,265,317 B1 * 7/2001 Chiu et al. ................... 438/711

OTHER PUBLICATIONS

Stanley Wolf et al. "Silicon Processing for the VLSI era vol. 1: Process Technology" Lattice Press p 283.*

* cited by examiner

*Primary Examiner*—Van Thu Nguyen
*Assistant Examiner*—Bradley Smith
(74) *Attorney, Agent, or Firm*—Tung & Associates

(57) ABSTRACT

Within a method for forming a microelectronic fabrication, there is ion implanted into a corner of a topographic feature within a microelectronic substrate a dose of an implanting ion such as to effect rounding of the corner of the topographic feature when thermally oxidizing the microelectronic substrate. The dose of the implanting ion is implanted while employing a laterally etched mask layer as an ion implantation mask layer which exposes the corner. The dose of the implanting ion is selected from the group consisting of silicon containing ions, germanium containing ions, arsenic containing ions, phosphorus containing ions and boron containing ions, such to provide for rounding of the corner with enhanced process efficiency.

18 Claims, 2 Drawing Sheets

ION IMPLANT METHOD FOR TOPOGRAPHIC FEATURE CORNER ROUNDING

BACKGROUND OF THE INVENTION

1. Field of the Invention

The present invention relates generally to methods for forming topographic features within microelectronic substrates. More particularly, the present invention relates to methods for forming, with rounded corners, topographic features within microelectronic substrates.

2. Description of the Related Art

Common in the art of semiconductor fabrication when fabricating semiconductor integrated circuits within semiconductor substrates is the use of isolation regions formed within isolation trenches which in turn define active regions of the semiconductor substrates. Isolation regions formed within isolation trenches generally provide an effective means for electrically isolating various semiconductor devices formed within the active regions of the semiconductor substrates.

While isolation regions formed within isolation trenches are thus clearly desirable in the art of microelectronic fabrication and often essential in the art of microelectronic fabrication, isolation regions formed within isolation trenches are nonetheless not entirely without problems in the art of microelectronic fabrication.

In that regard, as microelectronic integration levels have increased and microelectronic device dimensions have decreased, it has become increasingly difficult in the art of microelectronic fabrication, and in particular in the art of semiconductor integrated circuit microelectronic fabrication, to fabricate isolation trenches and isolation regions with limited detrimental impact to microelectronic devices, and in particular semiconductor devices, formed within active regions adjacent the isolation trenches and isolation regions.

It is thus towards the goal of forming within semiconductor substrates isolation trenches and isolation regions with limited detrimental impact to semiconductor devices formed within active regions adjacent the isolation trenches and isolation regions that the present invention is directed.

Various methods have been disclosed in the art of microelectronic fabrication for forming, with desirable properties, isolation regions within isolation trenches within microelectronic substrates.

Included among the methods, but not limited among the methods, are methods disclosed within Fuller et al., in U.S. Pat. No. 6,174,787 (an ion implantation method for forming, with round corners, isolation trenches within semiconductor substrates), the disclosure of which is incorporated herein fully by reference.

Desirable in the art of microelectronic fabrication are additional methods for forming within microelectronic substrates isolation trenches and isolation regions with limited detrimental impact to microelectronic devices formed within active regions adjacent the isolation trenches and isolation regions.

It is towards the foregoing object that the present invention is directed.

SUMMARY OF THE INVENTION

A first object of the present invention is to provide a method for forming an isolation region within an isolation trench within a microelectronic substrate.

A second object of the present invention is to provide a method in accord with the first object of the present invention, wherein the isolation region and the isolation trench are formed with limited detrimental impact to a microelectronic device formed within an active region adjacent the isolation trench and the isolation region.

In accord with the objects of the present invention, there is provided by the present invention a method for fabricating a microelectronic fabrication.

To practice the method of the present invention, there is first provided a microelectronic substrate having formed therein a topographic feature defined by a mask layer formed over the microelectronic substrate. There is then laterally etched the mask layer to form a laterally etched mask layer which uncovers a corner of the topographic feature. There is then ion implanted into the corner of the topographic feature, while employing the laterally etched mask layer as an ion implantation mask layer, a dose of an ion selected from the group consisting of silicon containing ions, germanium containing ions, arsenic containing ions, phosphorus containing ions and boron containing ions. Finally, there is then thermally oxidized the microelectronic substrate to form adjoining the topographic feature a thermal oxide layer.

Within the invention, the dose of the ion is of a mass, density and energy such that when thermally oxidizing the microelectronic substrate the corner of the topographic feature is rounded when forming the thermal oxide layer.

The invention provides particular value within the context of forming, with a rounded corner, an isolation trench within a semiconductor substrate.

The present invention provides a method for forming an isolation region within an isolation trench within a microelectronic substrate, wherein the isolation region and the isolation trench are formed with limited detrimental impact to a microelectronic device formed within an active region adjacent the isolation trench and the isolation region.

The present invention realizes the foregoing object by ion implanting a corner of a topographic feature within a microelectronic substrate, such as a corner of a trench within a semiconductor substrate, with a dose of an ion selected from the group consisting of silicon containing ions, germanium containing ions, arsenic containing ions, phosphorus containing ions and boron containing ions, such that when thermally oxidizing the microelectronic substrate to form a thermal oxide layer adjoining the topographic feature, such as a thermal oxide liner layer within the trench, the corner of the topographic feature is rounded. Within the present invention, the corner of the topographic feature is ion implanted while employing a laterally etched mask layer formed from a mask layer originally registered with respect to the topographic feature.

BRIEF DESCRIPTION OF THE DRAWINGS

The objects, features and advantages of the present invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENT

The present invention provides a method for forming an isolation region within an isolation trench within a microelectronic substrate, wherein the isolation region and the isolation trench are formed with limited detrimental impact to a microelectronic device formed within an active region adjacent the isolation trench and the isolation region.

The present invention realizes the foregoing object by ion implanting a corner of a topographic feature within a microelectronic substrate, such as a corner of a trench within a semiconductor substrate, with a dose of an ion selected from the group consisting of silicon containing ions, germanium containing ions, arsenic containing ions, phosphorus containing ions and boron containing ions, such that when thermally oxidizing the microelectronic substrate to form a thermal oxide layer adjoining the topographic feature, such as a thermal oxide liner layer within the trench, the corner of the topographic feature is rounded. Within the present invention, the corner of the topographic feature is ion implanted while employing a laterally etched mask layer formed from a mask layer originally registered with the topographic feature.

While the preferred embodiment of the present invention illustrates the present invention most particularly within the context of forming within a semiconductor substrate an isolation trench with a rounded corner such that there may be formed within an active region of the semiconductor substrate adjacent the isolation trench (and an isolation region formed therein) a semiconductor device with enhanced performance, the present invention is not intended to be so limited.

Rather, the present invention may be employed for forming, with rounded corners, topographic features such as but not limited to trenches and plateaus within microelectronic substrates including but not limited to semiconductor substrates and non-semiconductor substrates, provided that the microelectronic substrates are formed of microelectronic materials subject to thermal oxidation to form adjoining thereto a thermal oxide layer with differential consumption of a microelectronic substrate incident to being implanted with an ion selected from the group including but not limited to (but preferably consisting of) silicon containing ions, germanium containing ions, arsenic containing ions, phosphorus containing ions and boron containing ions.

Referring now to FIG. 1 to FIG. 7, there is shown a series of schematic cross-sectional diagrams illustrating the results of progressive stages of fabricating, in accord with a preferred embodiment of the present invention, a semiconductor substrate having formed therein an isolation trench in turn having formed therein an isolation region.

Figure 1:
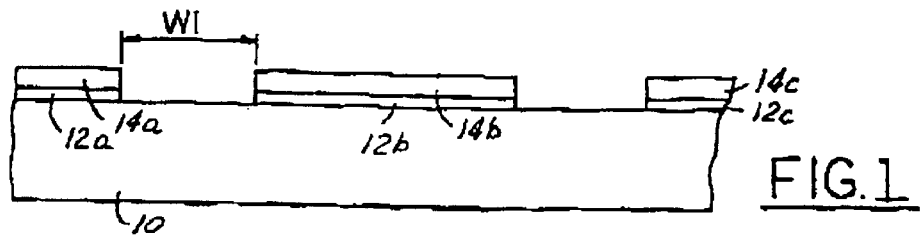
FIG. 1, FIG. 2, FIG. 3, FIG. 4, FIG. 5, FIG. 6 and FIG. 7 show a series of schematic cross-sectional diagrams illustrating the results of progressive stages of fabricating, in accord with a preferred embodiment of the present invention, a semiconductor substrate having formed therein an isolation trench having formed therein an isolation region.

Shown in FIG. 1 is a schematic cross-sectional diagram of the semiconductor substrate at an early stage in its fabrication in accord with the preferred embodiment of the present invention.

Shown in FIG. 1 is a semiconductor substrate 10 having formed thereupon a series of patterned pad oxide layers 12a, 12b and 12c in turn having formed aligned thereupon a series of patterned silicon nitride layers 14a, 14b and 14c, both series of which in an aggregate serve as a series of patterned mask layers with respect to the semiconductor substrate 10. As is illustrated within the schematic cross-sectional diagram of FIG. 1, the series of patterned mask layers exposes portions of the semiconductor substrate 10 with a bidirectional (i.e., areal) linewidth W1 of from about 0.3 to about 0.8 microns.

Within the preferred embodiment of the present invention, the semiconductor substrate 10 is formed of a semiconductor material which is susceptible to oxidation to form an oxide layer upon the semiconductor substrate 10. Such semiconductor materials may include, but are not limited to silicon semiconductor materials, germanium semiconductor materials and silicon-germanium alloy semiconductor materials.

Within the preferred embodiment of the present invention, the series of patterned pad oxide layers 12a, 12b and 12c is typically and preferably formed incident to thermal oxidation of the semiconductor substrate 10, such as to typically and preferably form the series of patterned pad oxide layers 12a, 12b and 12c of thickness of from about 30 to about 100 angstroms.

Within the preferred embodiment of the present invention, the series of patterned silicon nitride layers 14a, 14b and 14c may be formed employing any of several methods as are conventional in the art of microelectronic fabrication, to form each of the series of patterned silicon nitride layers 14a, 14b and 14c of thickness from about 500 to about 1500 angstroms.

Figure 2:
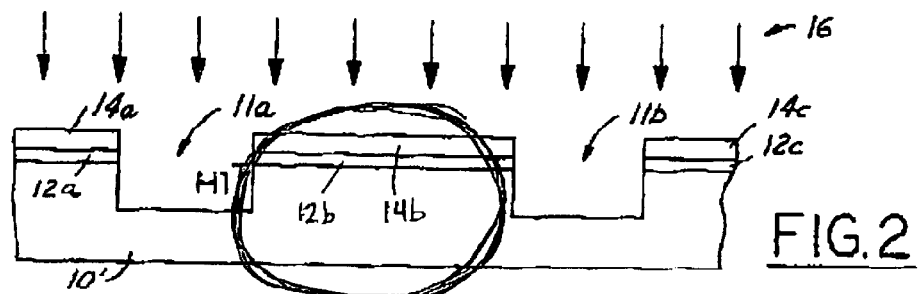

Referring now to FIG. 2, there is shown a schematic cross-sectional diagram illustrating the results of further processing of the semiconductor substrate whose schematic cross-sectional diagram is illustrated in FIG. 1.

As is illustrated within the schematic cross-sectional diagram of FIG. 2, the semiconductor substrate 10 is partially etched to form a partially etched semiconductor substrate 10' having defined therein a pair of isolation trenches 11a and 11b, while employing the series of patterned pad oxide layers 12a, 12b and 12c and the series of patterned silicon nitride layers 14a, 14b and 14c as an etch mask layer, in conjunction with an etching plasma 16.

Within the preferred embodiment of the present invention, the etching plasma 16 will typically and preferably employ an etchant gas composition appropriate to the semiconductor material from which is formed the semiconductor substrate 10. Typically and preferably, the etchant gas composition will include a chlorine containing etchant gas. Typically and preferably, each of the pair of isolation trenches 11a and 11b is formed to a depth H1 within the partially etched semiconductor substrate 10' of from about 2000 to about 4000 angstroms.

Figure 3:
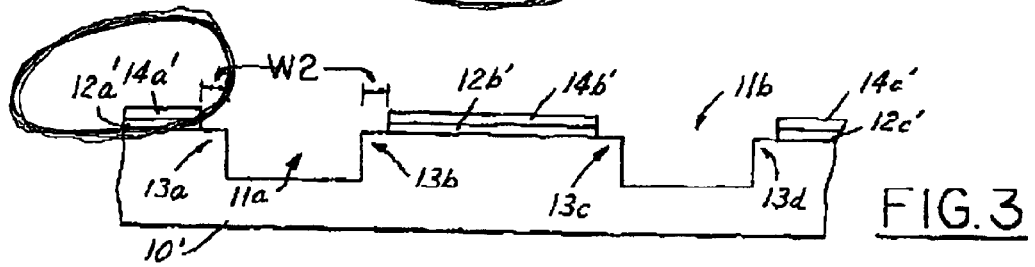

Referring now to FIG. 3, there is shown a schematic cross-sectional diagram illustrating the results of further processing of the semiconductor substrate whose schematic cross-sectional diagram is illustrated in FIG. 2.

As is illustrated within the schematic cross-sectional diagram of FIG. 3, the series of patterned pad oxide layers 12a, 12b and 12c and the series of patterned silicon nitride layers 14a, 14b and 14c are laterally etched to form a corresponding series of laterally etched patterned pad oxide layers 12a', 12b' and 12c' and laterally etched patterned silicon nitride layers 14a', 14b' and 14c', which in turn expose a series of corners 13a, 13b, 13c and 13d of the pair of isolation trenches 11a and 11b. Within the preferred embodiment of the present invention, the series of patterned pad oxide layers 12a, 12b and 12c and the series of patterned silicon nitride layers 14a, 14b and 14c are laterally etched for a lateral etchback linewidth W2 of from about 0.005 to about 0.02 microns when forming therefrom the corresponding series of laterally etched patterned pad oxide layers 12a', 12b' and 12c' and the corresponding series of laterally etched patterned silicon nitride layers 14a', 14b' and 14c'.

Within the preferred embodiment of the present invention, the foregoing lateral etching of the series of patterned silicon nitride layers 14a, 14b and 14c may be effected coincident with vertical etching of the series of patterned silicon nitride layers 14a, 14b and 14c within an aqueous phosphoric acid etchant solution, for a controlled time interval. Similarly, the series of patterned pad oxide layers 12a, 12b and 12c may be laterally etched to form the series of laterally etched patterned pad oxide layers 12a', 12b' and 12c', when formed of a silicon oxide material, by employing the series of laterally etched patterned silicon nitride layers 14a', 14b' and 14c' as an etch mask layer, in conjunction with an aqueous hydrofluoric acid containing etchant.

Figure 4:
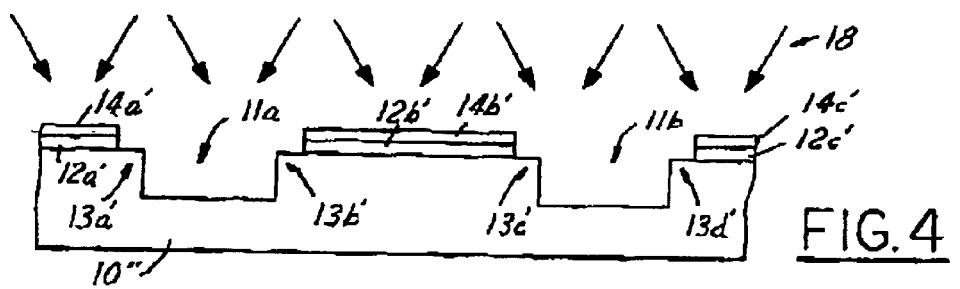

Referring now to FIG. 4, there is shown a schematic cross-sectional diagram illustrating the results of further processing of the semiconductor substrate whose schematic cross-sectional diagram is illustrated in FIG. 3.

As is illustrated in FIG. 4, the partially etched semiconductor substrate 10' is ion implanted with a dose of implanting ions 18, while employing the series of laterally etched patterned silicon nitride layers 14a', 14b' and 14c' and the series of laterally etched patterned pad oxide layers 12a', 12b' and 12c' as an ion implantation mask, to provide an ion implanted partially etched semiconductor substrate 10''. Within the ion implanted partially etched semiconductor substrate 10'', the corners 13a, 13b, 13c and 13d of the pair of isolation trenches 11a and 11b are ion implanted to form a series of ion implanted corners 13a', 13b', 13c' and 13d' within the pair of isolation trenches 11a and 11b within the ion implanted partially etched semiconductor substrate 10''.

Within the preferred embodiment of the present invention, and in particular when the semiconductor substrate 10 is formed of a semiconductor material selected from the group consisting of silicon semiconductor materials, germanium semiconductor materials and silicon-germanium alloy semiconductor materials, it has been found to be particularly desirable within the present invention that the dose of implanting ions 18 be selected from the group including but not limited to (and more particularly consisting of) silicon containing ions (such as but not limited to silicon, silicon chloride, silicon fluoride and silicon hydride ions), germanium containing ions (such as but not limited to germanium, germanium chloride, germanium fluoride and germanium hydride ions), arsenic containing ions (such as but not limited to arsenic, arsenic chloride, arsenic fluoride and arsenic hydride ions) phosphorus containing ions (such as but not limited to phosphorus, phosphorus chloride, phosphorus fluoride and phosphorus hydride ions), and boron containing ions (such as but not limited to boron, boron chloride, boron fluoride ions and boron hydride ions), such that upon implanting the corners 13a, 13b, 13c and 13d of the isolation trenches 11a and 11b with the dose of implanting ions 18 there is introduced into the doped corners 13a', 13b', 13c' and 13d' of the isolation trenches 11a and 11b a material which is otherwise intrinsically present or needed within the ion implanted partially etched semiconductor substrate 10''. Such a selection for the implanting ions 18 may provide for fabrication efficiency. Generally heavier implanting ions, of greater than about 50 amu, are preferred within the present invention.

Typically and preferably, the dose of implanting ions 18 is provided at an ion implantation density of from about 1E14 to about 5E15 implanting ions per square centimeter, an ion implantation energy of from about 10 to about 50 kev and a tilt angle of from about 5 to about 15 degrees with respect to a normal to the ion implanted partially etched semiconductor substrate 10''.

Figure 5:
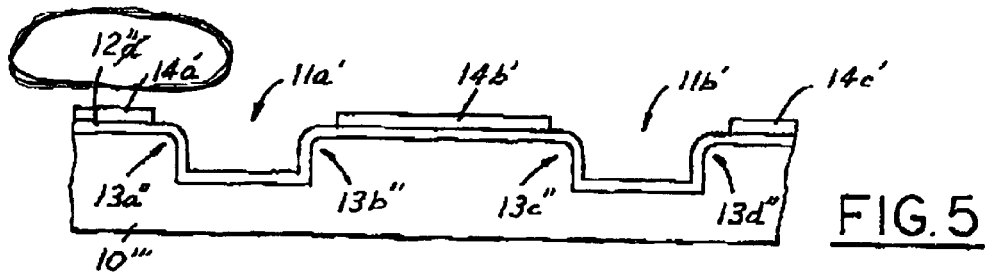

Referring now to FIG. 5, there is shown a schematic cross-sectional diagram illustrating the results of further processing of the semiconductor substrate whose schematic cross-sectional diagram is illustrated in FIG. 4.

As is shown within FIG. 5, the ion implanted partially etched semiconductor substrate 10'' is thermally annealed (and thermally oxidized) to form a thermally annealed ion implanted partially etched semiconductor substrate 10''' having formed thereupon a contiguous trench liner and pad oxide layer 12'' which incorporates the series of laterally etched patterned pad oxide layers 12a', 12b' and 12c'.

Within the preferred embodiment of the present invention, the ion implanted partially etched semiconductor substrate 10'' is thermally annealed and oxidized at a temperature of from about 900 to about 1200 degrees centigrade to form the contiguous trench liner and pad oxide layer 12'' of thickness from about 100 to about 200 angstroms.

As is further illustrated within the schematic cross-sectional diagram of FIG. 5, the series of ion implanted corners 13a', 13b', 13c' and 13d' within the ion implanted partially etched semiconductor substrate 10'', incident to being ion implanted with the dose of implanting ions 18 employing materials and conditions as noted above, are blunted and rounded when forming the contiguous trench liner and pad oxide layer 12'', to thus form therefrom a series of rounded corners 13a'', 13b'', 13c'' and 13d'' within a pair of attenuated isolation trenches 11a' and 11b' within the thermally annealed ion implanted partially etched semiconductor substrate 10'''.

Figure 6:
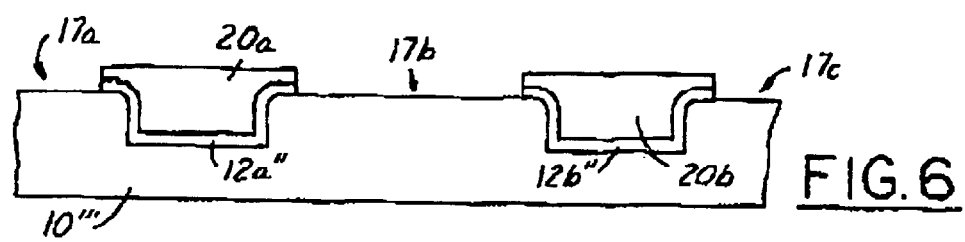

Referring now to FIG. 6, there is shown a schematic cross-sectional diagram illustrating the results of further processing of the semiconductor substrate whose schematic cross-sectional diagram is illustrated in FIG. 5.

As is illustrated in FIG. 6, there is: (1) filled into the pair of attenuated isolation trenches 11a' and 11b' a pair of isolation regions 20a and 20b; (2) stripped from the contiguous trench liner and pad oxide layer 12'' the series of laterally etched patterned silicon nitride layers 14a', 14b' and 14c'; and (3) etched the contiguous trench liner and pad oxide layer 12'' to form a pair of patterned trench liner layers 12a'' and 12b'' which leave exposed a series of active regions 17a, 17b and 17c of the thermally annealed ion implanted partially etched semiconductor substrate 10'''.

Within the preferred embodiment of the present invention, the foregoing series of process steps may be undertaken employing methods and materials as are generally conventional in the art of semiconductor integrated circuit microelectronic fabrication. Typically and preferably, the pair of isolation regions 20a and 20b is formed at least in part of a silicon oxide material planarized into the pair of attenuated isolation trenches 11a' and 11b'. In addition, the series of laterally etched patterned silicon nitride layers 14a', 14b' and 14c' may be stripped and the contiguous trench liner and pad oxide layer 12'' may be patterned while employing, respectively, aqueous phosphoric acid etchants and aqueous hydrofluoric acid etchants, as are otherwise generally conventional in the art of microelectronic fabrication.

Figure 7:
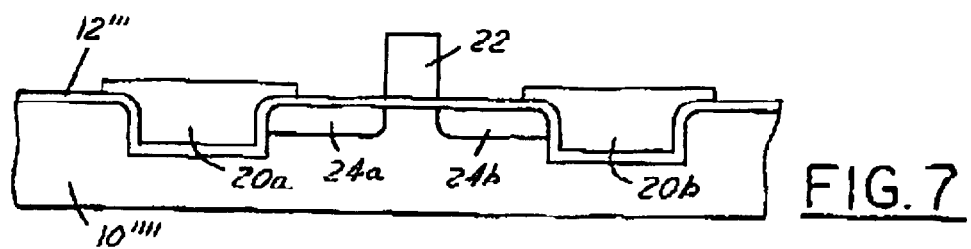

Referring now to FIG. 7, there is shown a schematic cross-sectional diagram illustrating the results of further processing of the semiconductor substrate whose schematic cross-sectional diagram is illustrated in FIG. 6.

Shown in FIG. 7, in a first instance, is a contiguous gate dielectric and trench liner layer 12''' which results from reoxidation of the thermally annealed ion implanted partially etched semiconductor substrate 10''' at a thermal annealing and oxidation temperature of from about 900 to about 1100 degrees centigrade, to form therefrom a twice thermally annealed ion implanted partially etched semiconductor substrate 10''''.

Similarly, there is also shown within the schematic cross-sectional diagram of FIG. 7, and formed within the active region 17b of the twice thermally annealed ion implanted partially etched semiconductor substrate 10"" a field effect transistor (FET) device which further comprises a gate electrode 22 and a pair of source/drain regions 24a and 24b.

Within the preferred embodiment of the present invention, the gate electrode 22 and the pair of source/drain regions 24a and 24b may be formed employing methods, materials and dimensions as are otherwise generally conventional in the art of semiconductor integrated circuit microelectronic fabrication.

As is understood by a person skilled in the art, the field effect transistor (FET) device formed within the active region 17b of the twice thermally annealed ion implanted partially etched semiconductor substrate 10"" is formed with enhanced performance and limited detrimental impact from the isolation trenches or the isolation regions 20a and 20b, since the pair of attenuated isolation trenches 11a' and 11b' is formed rounded corners.

EXAMPLE

To illustrate the value of the present invention, a series of field effect transistor (FET) devices was formed within a series of silicon semiconductor substrates fabricated generally in accord with the preferred embodiment of the present invention. The series of silicon semiconductor substrates was fabricated with a lateral etching of a series of patterned silicon nitride mask layers and patterned pad oxide mask layers for a lateral linewidth distance of about 0.01 microns to expose a series of corners of a series of isolation trenches formed within the series of semiconductor substrates. The series of corners of the series of isolation trenches was then ion implanted with silicon ions at a density of about 2E15 silicon ions per square centimeter, an ion implantation energy of about 35 kev and a tilt angle of about 7 degrees.

For comparison purposes, a second series of field effect transistor (FET) devices was fabricated within a second series of semiconductor substrates absent an analogous ion implantation treatment into a series of corners of a series of isolation trenches formed within the second series of semiconductor substrates.

There was then measured leakage currents for both of the series of field effect transistor (FET) devices. Observed were, leakage current reductions of from about 10 to about 40 percent for field effect transistor (FET) devices formed within semiconductor substrates fabricated in accord with the invention.

As is understood by a person skilled in the art, the preferred embodiment of the present invention is illustrative of the present invention rather than limiting of the present invention. Revisions and modifications may be made to methods, materials, structures and dimensions employed for fabricating a semiconductor substrate in accord with the preferred embodiment of the present invention, while still fabricating a microelectronic fabrication in accord with the present invention, further in accord with the accompanying claims.

What is claimed is:

1. A method for fabricating a microelectronic fabrication comprising:
   providing a microelectronic substrate having formed therein a topographic feature defined by a mask layer formed over the microelectronic substrate;
   laterally etching the mask layer to form a laterally etched mask layer which uncovers a corner of the topographic feature;
   ion implanting into the corner of the topographic feature, while employing the laterally etched mask layer as an ion implantation mask layer, a dose of an ion selected from the group consisting of arsenic containing ions, phosphorus containing ions and boron containing ions; and
   thermally oxidizing the microelectronic substrate to form adjoining the topographic feature a thermal oxide layer.

2. The method of claim 1 wherein the dose of the ion is of a mass, density and energy such that when thermally oxidizing the microelectronic substrate the corner of the topographic feature is rounded when fanning the thermal oxide layer.

3. The method of claim 1 wherein the microelectronic substrate is selected from the group consisting of silicon substrates, germanium substrates and silicon-germanium alloy substrates.

4. The method of claim 1 wherein the topographic feature is selected from the group consisting of a trench and a plateau.

5. The method of claim 1 wherein the mask layer is laterally etched for a lateral distance of from about 0.005 to about 0.02 microns when forming the lateral etched mask layer.

6. A method for fabricating a semiconductor microelectronic fabrication comprising:
   providing a semiconductor substrate having formed therein a topographic feature defined by a mask layer formed over the semiconductor substrate;
   laterally etching the mask layer to form a laterally etched mask layer which uncovers a corner of the topographic feature;
   ion implanting into the corner of the topographic feature, while employing the laterally etched mask layer as an ion implantation mask layer, a dose of an ion selected from the group consisting of arsenic containing ions, phosphorus containing ions and boron containing ions; and
   thermally oxidizing the semiconductor substrate to form adjoining the topographic feature a thermal oxide layer.

7. The method of claim 6 wherein the dose of the ion is of amass, density and energy such that when thermally oxidizing the semiconductor substrate the corner of the topographic feature is rounded when forming the thermal oxide layer.

8. The method of claim 6 wherein the semiconductor substrate is selected from the group consisting of silicon semiconductor substrates, germanium semiconductor substrates and silicon-germanium alloy semiconductor substrates.

9. The method of claim 6 wherein the topographic feature is selected from the group consisting of a trench and a plateau.

10. The method of claim 6 wherein the mask layer is laterally etched for a lateral distance of from about 0.005 to about 0.02 microns when forming the lateral etched mask layer.

11. The method of claim 6 wherein the topographic feature is an isolation trench.

12. The method of claim 11 further comprising forming into the isolation trench an isolation region.

13. The method of claim 1 wherein the ion is an arsenic containing ion.

14. The method of claim 1 wherein the ion is a phosphorus containing ion.

15. The method of claim 1 wherein the ion is a boron containing ion.

16. The method of claim 6 wherein the ion is an arsenic containing ion.

17. The method of claim 6 wherein the ion is a phosphorus containing ion.

18. The method of claim 6 wherein the ion is a boron containing ion.

* * * * *